(12) United States Patent
Wang et al.

(10) Patent No.: US 8,964,132 B2
(45) Date of Patent: Feb. 24, 2015

(54) COLOR FILTER SUBSTRATE AND CAPACITIVE TOUCH SCREEN

(75) Inventors: Shijun Wang, Beijing (CN); Xiaochuan Chen, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 128 days.

(21) Appl. No.: 13/700,889

(22) PCT Filed: Aug. 28, 2012

(86) PCT No.: PCT/CN2012/080671
§ 371 (c)(1),
(2), (4) Date: Nov. 29, 2012

(87) PCT Pub. No.: WO2013/034060
PCT Pub. Date: Mar. 14, 2013

(65) Prior Publication Data
US 2013/0112542 A1 May 9, 2013

(30) Foreign Application Priority Data

Sep. 9, 2011 (CN) ...................... 2011 2 0339177 U

(51) Int. Cl.
*G02F 1/1335* (2006.01)
*G02B 5/20* (2006.01)
(Continued)

(52) U.S. Cl.
CPC ............... *G02B 5/20* (2013.01); *G06F 3/0412* (2013.01); *G06F 3/044* (2013.01); *H03K 17/9622* (2013.01); *G02F 1/133514* (2013.01)
USPC .............................. 349/12; 349/106; 349/110

(58) Field of Classification Search
CPC ..... G06F 3/0412; G06F 3/044; G06F 3/0416; G06F 3/047; G06F 3/041; G06F 3/0414; G06F 2203/04103; G06F 2203/04112; G06F 2203/04111; G02F 1/13338; G02F 1/133512; G02F 1/1343; G02F 1/133514; G02F 1/133509; G02F 1/134336; G02F 1/136209; G02F 2001/136218; G09G 2300/0426; G09G 2300/0452
USPC ........ 345/173, 174, 87, 175, 92; 349/12, 106, 349/111, 138, 139, 110; 438/70; 178/18.01, 178/18.03, 18.06, 19.01
See application file for complete search history.

(56) References Cited

U.S. PATENT DOCUMENTS 5,568,292 A   10/1996  Kim
6,057,903 A * 5/2000  Colgan et al. ................. 349/139
(Continued)

FOREIGN PATENT DOCUMENTS

CN   101251667 A   8/2008
CN   101988999 A   3/2011
(Continued)

OTHER PUBLICATIONS

International Search Report mailed Nov. 11, 2012; PCT/CN2012/080671.
(Continued)

*Primary Examiner* — Thoi Duong
(74) *Attorney, Agent, or Firm* — Ladas & Parry LLP

(57) ABSTRACT

The present disclosure relates to a color filter and a capacitive touch screen. Said color filter comprises a substrate; a color filter film formed on the substrate and comprising a plurality of sub-pixel regions; and a sensing layer formed on the substrate and comprising a first metal layer, a second metal layer and an insulting layer located between the first metal layer and the second metal layer. At least one of the first metal layer, the second metal layer and the insulating layer is made of a light shielding material, the light shielding material is projected on the color filter film as a grid and shields the boundaries between respective sub-pixel regions. According to the present disclosure, the number of layers produced is reduced, production process is optimized, and the cost is reduced and the color filter substrate is thinner and lighter compared with the conventional color filter substrate.

8 Claims, 3 Drawing Sheets

(51) Int. Cl.
  *G06F 3/041* (2006.01)
  *G06F 3/044* (2006.01)
  *H03K 17/96* (2006.01)

(56) References Cited

U.S. PATENT DOCUMENTS

| | | | |
|---|---|---|---|
| 7,924,350 B2 * | 4/2011 | Ma et al. | 349/12 |
| 8,013,943 B2 * | 9/2011 | Tanaka et al. | 349/12 |
| 8,134,527 B2 * | 3/2012 | Chien et al. | 345/88 |
| 2009/0096760 A1 | 4/2009 | Ma et al. | |
| 2011/0063239 A1 | 3/2011 | Xie et al. | |

FOREIGN PATENT DOCUMENTS

| | | |
|---|---|---|
| CN | 102023733 A | 4/2011 |
| JP | 2009-098629 A | 5/2009 |

OTHER PUBLICATIONS

Korea First Office Action dated Feb. 25, 2014; Appln. No. 10-2012-7032318.

International Preliminary Report on Patentability dated Mar. 12, 2014; PCT/CN2012/080671.

* cited by examiner

COLOR FILTER SUBSTRATE AND CAPACITIVE TOUCH SCREEN

CROSS REFERENCE TO RELATED APPLICATIONS

This application is a national stage application under 35 U.S.C. 371 and claims the benefit of PCT Application No. PCT/CN2012/080671 having an international filing date of Aug. 28, 2012, which designated the United States, which PCT application claimed the benefit of Chinese Application No. 201120339177.6 filed Sep. 9, 2011, the disclosure of both the above-identified applications are incorporated herein by reference.

TECHNICAL FIELD

The present disclosure relates to a liquid crystal display (LCD), and in particular relates to a color filter substrate and a capacitive touch screen.

BACKGROUND

The touch screen LCD display developed quickly, and it has already evolved into a mainstream flat panel display. The manufacturing process of a LCD display mainly includes producing a color filter (CF) substrate including forming a black matrix (BM), a color filter film, a planarization layer and a common electrode on a substrate in this order; producing an array substrate; performing alignment treatment for the array substrate and the color filter substrate, injecting liquid crystal after assembling of the array substrate and the color filter substrate so as to form a liquid crystal cell; assembling polarizers, backlight and driving circuit so as to form a module with separate standard external interface. As shown in FIG. 1, in a process of producing a color filter substrate, a layer of black matrix 12 is firstly produced on the substrate 11 for preventing the color blending of adjacent sub-pixels in respective pixel. However, this black matrix 12 induces a poor surface flatness in the subsequent process for producing the color filter film (color paste), that is, Red (R), Green (G) and Blue (B) color pastes, which makes it difficult to make the common electrode 14 thereon. As a result, a planarization layer 13 is added for planarization so as to prepare for the common electrode 14.

Generally, the touch screen is manufacturing by adding a sensing layer for determining touch points on the liquid crystal panel. For capacitive touch screen, the capacitive sensor is usually manufactured on the rear surface of a substrate of color filter substrate. As shown in FIG. 2, the capacitive sensor comprises an upper and lower layer made of transparent conductive film 15 (Indium Tin Oxides, ITO) and a layer of insulating film 16 sandwiched between two layers of transparent conductive film 15. The upper and lower layer made of transparent conductive film 15 serve as an upper plate 17 and a lower plate 18 of the capacitor, respectively. When the touch screen is touched, the capacitance of the touch point changes, which induces variation of either the current or pulse signal in transverse and longitudinal directions, which is detected by the sensors in transverse and longitudinal directions, thus determining coordinates of the touch point in transverse and longitudinal directions and enabling addressing.

During manufacturing process of above touch screen, there are some issues such as the need to produce a plurality of layers and associated complex processing, which makes it difficult to reduce the cost of the touch screen and make the touch screen thin and light weight.

SUMMARY

The present disclosure provides a color filter substrate and capacitive touch screen which are thinner and lighter than the conventional color filter substrate and capacitive touch screen. And in the manufacturing process of such devices, the number of layers produced is reduced, the production process is optimized, and the cost is reduced.

According to one aspect, the present disclosure relates to a color filter substrate, comprising: a substrate; a color filter film formed on the substrate and comprising a plurality of sub-pixel regions; and a sensing layer formed on the substrate and comprising a first metal layer, a second metal layer and an insulting layer located between the first metal layer and the second metal layer. At least one of the first metal layer, the second metal layer and the insulating layer is made of a light shielding material, the light shielding material is projected on the color filter film as a grid and shields the boundaries between respective sub-pixel regions.

In one embodiment, both the first metal layer and the second metal layer of the sensing layer are made of said light shielding material.

In one embodiment, the insulating layer of the sensing layer is made of a transparent insulating material.

In one embodiment, a part of the insulating layer of the sensing layer is made of said light shielding material and said light shielding material forms a grid.

In one embodiment, the first metal layer and the second metal layer of the sensing layer are made of a transparent conductive material.

In one embodiment, the first metal layer and a part of the insulating layer of the sensing layer are made of light shielding materials.

In one embodiment, the second metal layer and a part of the insulating layer of the sensing layer are made of light shielding materials.

In one embodiment, the first metal layer is composed of a plurality of first metal stripes aligned with equal spacing in a first direction, the first metal stripe is formed of a plurality of wide portions and a plurality of narrow portions connected alternately and sequentially; the second metal layer is composed of a plurality of second metal stripes aligned with equal spacing in a second direction perpendicular to the first direction, wherein the second metal strip is formed of a plurality of wide portions and a plurality of narrow portions connected alternately and sequentially; the first metal stripe and the second metal stripe shield the boundaries between respective sub-pixel regions, the wide portion of the first metal stripe faces a corresponding wide portion of the second metal stripe, and these two wide portions form an upper plate and a lower plate of a capacitor of the sensor respectively, and the narrow portion of the first metal stripe and the narrow portion of the second metal stripe form wires connecting respective capacitors.

In one embodiment, the insulating layer is in a sheet-like shape.

In one embodiment, the sensing layer is located between the substrate and the color filter film.

In one embodiment, the sensing layer and the color filter film are located on the opposite sides of the substrate respectively.

According to another aspect, the present disclosure relates to a capacitive touch screen comprising the color filter substrate discussed as below.

According to the present disclosure, the metal layers or a part of the insulting layer in the sensing layer of the said color filter substrate and capacitive touch screen is made of light shielding materials, which also can block lights. The black matrix therefore can be omitted in the manufacturing process of the color filter substrate and capacitive touch screen of the present disclosure, reducing the thickness of the color filter substrate effectively. Moreover, because the black matrix is omitted, the color paste layer can be manufactured directly on the substrate. The flatness of the color paste is good, and there is no need to produce the planarization layer. Thus the number of produced layers is reduced, production process is optimized, and the cost is reduced and at the same time the devices are thinner and lighter compared with the conventional devices.

DETAILED DESCRIPTION OF THE PREFERRED EMBODIMENTS

The color filter substrate and capacitive touch screen of the present disclosure will be described below with reference to accompanying drawings.

Figure 1:
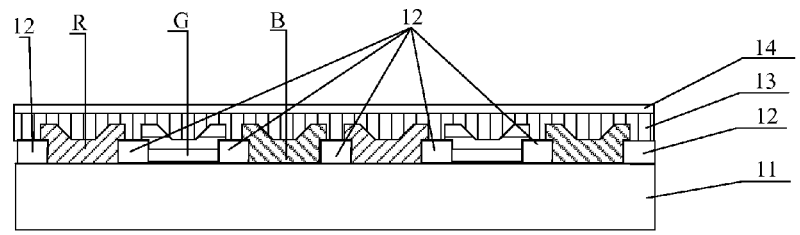
FIG. 1 is a schematic side sectional view of a color filter substrate of a conventional capacitive touch screen.
Figure 2:
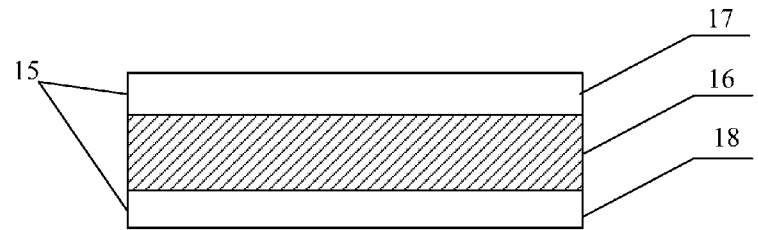
FIG. 2 is a schematic side sectional view of a capacitor of a conventional capacitive touch screen.
Figure 3:
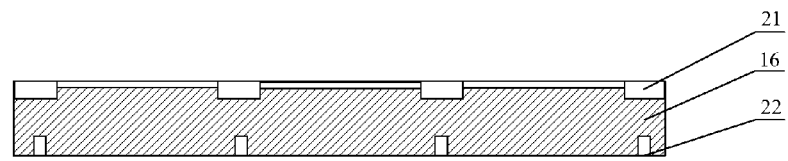
FIG. 3 is a schematic side sectional view of a sensing layer of a color filter substrate according to a first embodiment of the present disclosure.
Figure 4:
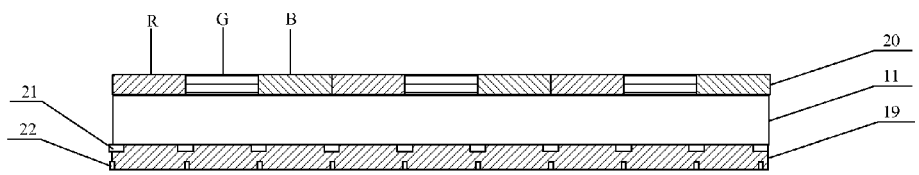
FIG. 4 is a schematic side sectional view of a color filter substrate according to the first embodiment of the present disclosure.
Figure 5:
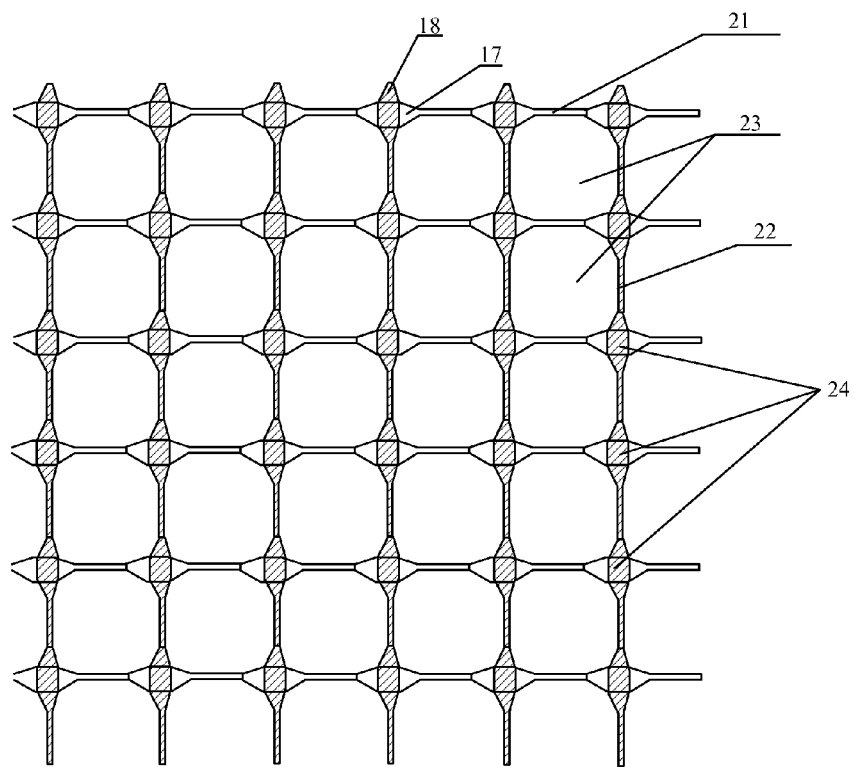
FIG. 5 is a schematic top view of upper and lower metal layers of the sensing layer of the color filter substrate according to the first embodiment of the present disclosure.

FIG. 3 shows a sensing layer of the color filter substrate according to the first embodiment according to the present disclosure. FIG. 4 is a schematic side sectional view of a color filter substrate according to the first embodiment of the present disclosure. FIG. 5 is a schematic top view of the upper and lower metal layer of the sensing layer of the color filter substrate according to the first embodiment of the present disclosure. This color filter substrate comprises a substrate 11, a color filter film 2 and a sensing layer 19. The color filter film 20 comprises a plurality of sub-pixel regions, such as the RGB sub-pixel regions showed in FIG. 4. The sensing layer 19 comprises a first metal layer 21, a second metal layer 22 and an insulating layer 16. The first metal layer 21 and the second metal layer 22 overlap each other and are made of light shielding materials, and form a grid as illustrated in the top view of FIG. 5, that is the projection of the light shielding materials of the first metal layer 21 and the second layer 22 form a grid on the color filter film and shield the locations between respective sub-pixel regions. The insulating layer 16 inserted between the first metal layer 21 and the second metal layer 22 is sheet-like, and is made of a transparent insulating material. As illustrated in FIG. 4, the first metal layer 21 and the second metal layer 22 shield the locations between respective sub-pixel regions of the color filter substrate, that is, the first metal layer 22 and second metal layer 21 block the lights from entering the boundaries between adjacent sub-pixel regions such as the boundary between sub-pixel R and sub-pixel G and the boundary between sub-pixel G and sub-pixel B.

As shown in FIG. 5, the first metal layer 21 comprises a plurality of first metal stripes aligned in the horizontal direction with equal spacing and each strip comprises a plurality of wide portions and narrow portions arranged alternately and connected sequentially.

The second metal layer 22 comprises a plurality of second metal stripes aligned in the vertical direction with equal spacing and comprising a plurality of wide portions and narrow portions arranged alternately and connected sequentially.

The first metal stripes and the second metal stripes are overlapped, which form a grid in the top view of FIG. 5, and shield the locations between respective sub-pixel regions. Each overlapped region of the first metal stripe and the second metal stripe forms a capacitor 24 for determining a touch point. The wide portion of the first metal stripe faces the wide portion of the second metal stripe, and these two wide portions serve as an upper plate 17 and a lower plate 18 of the capacitor of the sensor respectively. The narrow portion of the first metal stripe and the narrow portion of the second metal stripe form wires connecting respective capacitors.

When a touch point is touched, the capacitor 24 of the touch point changes, which induces the change of currents or the pulse signals from respective rows and columns in horizontal and vertical directions, which is transferred out by the wires between respective capacitor, thus the currents or the pulse signals are detected by the respective horizontal detectors and vertical detectors. In this way, the addressing is achieved by determining the coordinates of the touch point in horizontal and vertical directions from the detectors. Further, the first metal layer and the second metal layer surround a transparent region 23. Each transparent area 23 corresponding to one sub-pixel. The first metal layer 21 and the second metal layer 22 are located between adjacent respective transparent area 23, and the first and second metal layer are made of light shielding materials; therefore the area of respective sub-pixels are transparent and the boundaries between respective sub-pixels are shielded by the metal layers. In this way, the light transmitted through a transparent region 23 corresponding to a sub-pixel is prevented from being blended with the light transmitted through adjacent transparent regions corresponding to adjacent sub-pixels. Accordingly, the first metal layer and the second metal layer forming the plates of the capacitor in the sensing layer 19 also serve as the black matrix.

Since the sensing layer of the color filter substrate according to the first embodiment of the present disclosure can also block light and thus replace the black matrix in the conventional color filter substrate, the step of producing the black matrix can be omitted so that the color paste can be produced directly on the substrate. The surface of the color paste produced as above is flat without any necessity to produce additional planarization layer. In this way, the number of layers produced is reduced, production process is optimized, and the cost is reduced and the color filter substrate is thinner and lighter compared with the conventional color filter substrate.

As shown in FIG. 4, according to the first embodiment of the present disclosure, the sensing layer 19 and the color filter film 20 formed on the substrate 11 are disposed on the opposite sides of the substrate 11.

Figure 6:
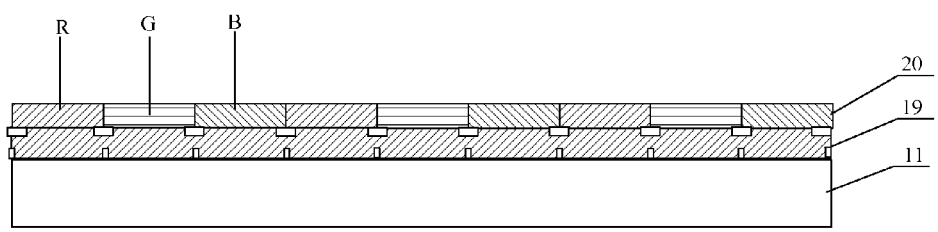
FIG. 6 is a schematic side sectional view of a color filter substrate according to a second embodiment of the present disclosure.

As shown in FIG. 6, according to the second embodiment of the present disclosure, the sensing layer 19 formed on the substrate 11 is disposed between the substrate 11 and color filter film 20.

Figure 7:
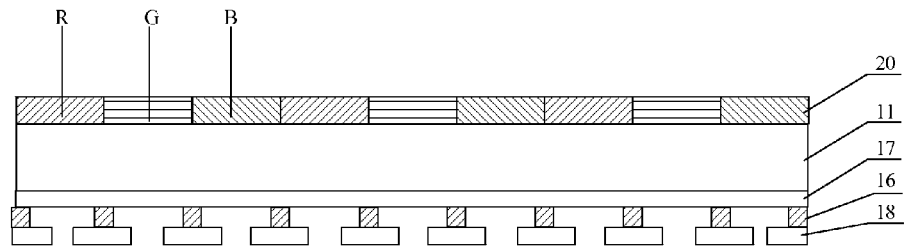
FIG. 7 is a schematic side sectional view of a color filter substrate of according to a third embodiment of the present disclosure.

As shown in FIG. 7, the present disclosure provides a third embodiment, which is different from the embodiments shown in FIG. 4 and FIG. 6. According to the third embodiment, a part of the insulating layer 16 in sensing layer is made of light shielding materials and forms a grid structure shielding locations between respective sub-pixels correspondingly. The first metal layer 17 and the second metal layer 18 are made of transparent conductive materials such as ITO.

Figure 8:
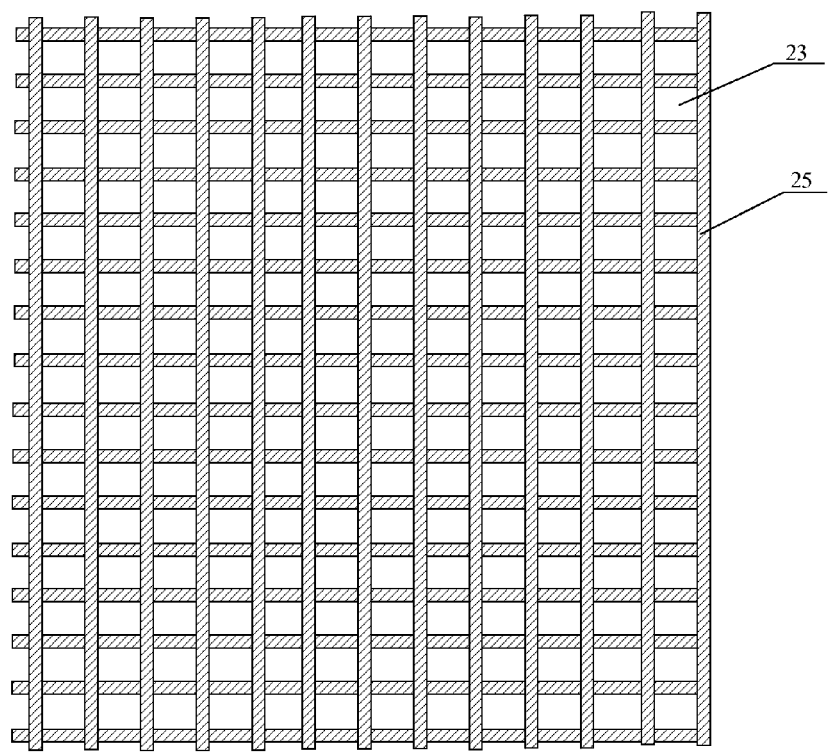
FIG. 8 is a schematic top view of an insulting layer according to the third embodiment of the present disclosure.

As shown in FIGS. 7 and 8, the insulating layer 16 of the third embodiment comprises a shielding portion 25 and a transparent portion forming the transparent region 23 surrounded by the shielding portion 25. In order to prevent the shorting of the sensing layer, the transparent portion is formed of a transparent insulating material. Each transparent region 23 corresponds to a sub-pixel region of the color filter substrate. And the shielding portion 25 surrounding the transparent region 23 is formed of an opaque insulating material, which shields the locations between respective sub-pixel regions. In this way, the light transmitted through a transparent region 23 corresponding to a sub-pixel is prevented from being blended with the light transmitted through adjacent transparent regions corresponding to adjacent sub-pixels. Accordingly, the shielding portion of the dielectric of the capacitor between metal plates can also serve as the black matrix.

In FIG. 7, the sensing layer 19 and the color filter film 20 are disposed on the opposite sides of the substrate 11. It is also can be conceived that the sensing layer 19 is disposed between the substrate 11 and the color filter film 20, similarly to the embodiment shown in FIG. 6.

According to the third embodiment of the present disclosure, a part of the insulating layer in the sensing layer of the color filter substrate is made of light shielding materials and forms a grid structure shielding the locations between respective sub-pixel regions and acting as the black matrix. Therefore the step of producing the black matrix can be omitted so that the color paste can be produced directly on the substrate. The surface of the color paste produced as above is flat without any necessity to produce additional planarization layer. In this way, the number of layers produced is reduced, production process is optimized, and the cost is reduced and the color filter substrate is thinner and lighter compared with the conventional color filter substrate.

In addition, in the embodiment of the present disclosure, the first metal layer and a part of the insulating layer in the sensing layer can be made of light shielding materials, so that the projections of the first metal layer and the part of the insulating layer on the color filter film can form a grid. Alternatively, the second metal layer and a part of the insulating layer in the sensing layer can be made of light shielding material as well, so that the projections of the second metal layer and the part of the insulating layer on the color filter film can form a grid. The color filter substrate according to the embodiments of the present disclosure is not limited to the above exact form, as long as at least one of the first metal layer, the second metal layer and insulating layer is made of light shielding materials, and the projections of the light shielding materials on the color filter film form a grid shielding the locations between respective sub-pixel regions.

The embodiments of the present disclosure further provide a capacitive touch screen including the above color filter substrate.

The capacitive touch screen according to the embodiment of the present disclosure can use any types of the color filter substrate according to the embodiments describe as above. The sensing layer of the color filter substrate can serve as the black matrix with the same shielding effect, thus according to the capacitive touch screen in the present embodiment, the step of producing the black matrix can be omitted so that the color paste can be produced directly on the substrate. The surface of the color paste produced as above is flat without any necessity to produce additional planarization layer. In this way, the number of layers produced is reduced, production process is optimized, and the cost is reduced and the color filter substrate is thinner and lighter compared with the conventional color filter substrate.

The above-mentioned is merely the detailed descriptions of the present disclosure, but the protecting scope is not limited to this. The modifications and alternatives thought of by any one of those skilled in the art in the technical scope disclosed by the present disclosure should be included within the protecting scope of the present disclosure. Thus the protecting scope of the present disclosure should subject to the protecting scope of the claims.

What is claimed is:

1. A color filter substrate, comprising:
   a substrate;
   a color filter film formed on the substrate and comprising a plurality of sub-pixel regions without a black matrix between the sub-pixel regions; and
   a sensing layer formed on the substrate and comprising a first metal layer, a second metal layer and an insulting layer located between the first metal layer and the second metal layer,
   wherein a part of the insulating layer of the sensing layer is made of a light shielding material and said light shielding material forms a grid, and the first metal and the second metal layer of the sensing layer are made of a transparent conductive material, the light shielding material is projected on the color filter film as a grid and shields the boundaries between respective sub-pixel regions.

2. The color filter substrate according to one of claim 1, wherein
   the first metal layer is composed of a plurality of first metal stripes aligned with equal spacing in a first direction, the first metal stripe is formed of a plurality of wide portions and a plurality of narrow portions connected alternately and sequentially;
   the second metal layer is composed of a plurality of second metal stripes aligned with equal spacing in a second direction perpendicular to the first direction, wherein the second metal strip is formed of a plurality of wide portions and a plurality of narrow portions connected alternately and sequentially;
   the first metal stripe and the second metal stripe shield the boundaries between respective sub-pixel regions, the wide portion of the first metal stripe faces a corresponding wide portion of the second metal stripe, and these two wide portions form an upper plate and a lower plate of a capacitor of the sensor respectively, and the narrow portion of the first metal stripe and the narrow portion of the second metal stripe form wires connecting respective capacitors.

3. The color filter substrate according to claim 1, wherein the sensing layer is located between the substrate and the color filter film.

4. The color filter substrate according to claim 1, wherein the sensing layer and the color filter film are located on the opposite sides of the substrate respectively.

5. A capacitive touch screen comprising a color filter substrate, the color filter substrate comprising:
   a substrate;
   a color filter film formed on the substrate and comprising a plurality of sub-pixel regions without a black matrix between the sub-pixel regions; and
   a sensing layer formed on the substrate and comprising a first metal layer, a second metal layer and an insulting layer located between the first metal layer and the second metal layer,
   wherein a part of the insulating layer of the sensing layer is made of a light shielding material and said light shielding material forms a grid, and the first metal layer and the second metal layer of the sensing layer are made of a transparent conductive material, the light shielding material is projected on the color filter film as a grid and shields the boundaries between respective sub-pixel regions.

6. The capacitive touch screen according to claim 5, wherein
   the first metal layer is composed of a plurality of first metal stripes aligned with equal spacing in a first direction, the first metal stripe is formed of a plurality of wide portions and a plurality of narrow portions connected alternately and sequentially;
   the second metal layer is composed of a plurality of second metal stripes aligned with equal spacing in a second direction perpendicular to the first direction, wherein the second metal strip is formed of a plurality of wide portions and a plurality of narrow portions connected alternately and sequentially;
   the first metal stripe and the second metal stripe shield the boundaries between respective sub-pixel regions, the wide portion of the first metal stripe faces a corresponding wide portion of the second metal stripe, and these two wide portions form an upper plate and a lower plate of a capacitor of the sensor respectively, and the narrow portion of the first metal stripe and the narrow portion of the second metal stripe form wires connecting respective capacitors.

7. The capacitive touch screen according to claim 5, wherein the sensing layer is located between the substrate and the color filter film.

8. The capacitive touch screen according to claim 5, wherein the sensing layer and the color filter film are located on the opposite sides of the substrate respectively.

* * * * *